United States Patent [19]

Hayashi

[11] Patent Number: 4,815,087
[45] Date of Patent: Mar. 21, 1989

[54] HIGH SPEED STABLE LIGHT EMITTING SEMICONDUCTOR DEVICE WITH LOW THRESHOLD CURRENT

[75] Inventor: Hideki Hayashi, Osaka, Japan
[73] Assignee: Sumitomo Elec. Industries, Ltd., Osaka, Japan
[21] Appl. No.: 863,609
[22] Filed: May 15, 1986
[30] Foreign Application Priority Data
    May 15, 1985 [JP]  Japan ................. 60-104188
[51] Int. Cl.⁴ ............................................. H01S 3/19
[52] U.S. Cl. ................................. 372/45; 372/96
[58] Field of Search ............ 372/45, 96, 44, 43
[56] References Cited
    FOREIGN PATENT DOCUMENTS
    0145692  8/1985  Japan ..................... 372/45
    0189981  9/1985  Japan ..................... 372/96
    0190992  8/1986  Japan ..................... 372/45

Primary Examiner—William L. Sikes
Assistant Examiner—B. Randolph
Attorney, Agent, or Firm—Dennis P. Clarke

[57] ABSTRACT

A highly efficient light emitting semiconductor device which is stable at high speeds and has a low threshold current comprising a first semiconductor layer of a first conductive type; a second semiconductor layer of the second conductive type which is different from the first conductive type; an active layer composed of laminated semiconductor layers of the quantum well structure interposed between the first and second semiconductor layers and having a narrower effective energy band gap than the first and second semiconductor layers and a diffraction grading formed in either one of the first or second semiconductor layers.

22 Claims, 5 Drawing Sheets

WAVE LENGTH

WAVE LENGTH

DFB LASER

DBR LASER

HIGH SPEED STABLE LIGHT EMITTING SEMICONDUCTOR DEVICE WITH LOW THRESHOLD CURRENT

BACKGROUND OF THE INVENTION

The present invention relates to a light emitting semiconductor device. More particularly, the present invention relates to a high efficient semiconductor laser having a stable operation at a high speed and being operable by a low threshold current for laser oscillation.

Upon applying a double heterojunction structure designed by I. Hayashi and M. B. Panish in 1970 to an injection type semiconductor laser invented in 1962, the semiconductor laser has been greatly advanced in practical use. For example, the semiconductor laser becomes capable of continuous wave oscillation at room temperature as referred to "J. APPL. PHYS.", I. Hayashi, M. B. Panish, 41, 150 (1970).

FIG. 1 is a structural diagram showing its sectional view of the double heterojunction (DH) semiconductor laser of the injection type.

In FIG. 1, a first cladding layer 22 of n-type $Al_xGa_{1-x}As$, an active layer 23 of undoped GaAs, a second cladding layer 24 of p-type $Al_xGa_{1-x}As$ and p-type GaAs layer 25 are formed in the above stated order on a substrate 21 of n-type GaAs. Further, the semiconductor laser device thus constructed is subjected to formation of an ohmic electrode 27 on the back surface of the substrate 21 and an ohmic electrode 26 of stripe type on the upper surface of the p-type GaAs layer 25. In particular, a refractive index of the active layer 23 is greater than those of the cladding layers 22 and 24 which sandwich the active layer 23 therebetween. The three layers thus constructed constitutes a refractive index-waveguiding structure.

In the double heterojunction structure, electrons and holes are injected respectively from the n-type (first) cladding layer 22 and the p-type (second) cladding layer 24 having wide energy band-gaps into the active layer 22 having a narrow energy band gap so as to confine them within the active layer. That is a so-called "carrier confinement effect". Accordingly, if the active layer 23 is formed of a thin layer, a high injection carrier density, that is, a high gain is obtained by using a small amount of current. Furthermore, with the refractive index-waveguiding structure, light caused by recombination propagates only within the active layer 23 having a high refractive index so that the scattering of the light is prevented (optical confinement) and the threshold current for oscillation is lowered.

Oscillation spectrum of the double heterojunction laser device thus constructed is made to a single mode oscillation in DC modulation by dispensing a suitable carrier confinement in the transverse direction thereto.

When the double heterojunction laser device is used in high-speed modulation, however, a multi mode oscillating spectra consisting of plural axial mode oscillating spectra are observed as shown in FIG. 2a. In order to prevent the multi mode of oscillating spectra in high-speed modulation, there have been proposed, DFB (Distributed Feedback) laser described in "Applied Physics Letter", J. Kuroda, 33, 173 (1978) and DBR (Distributed Bragg Reflector) laser described in "Electronics Letter", Y. Abe et al., 18, 410 (1982). FIG. 3a is a structural diagram showing the sectional view of the DFB laser device. FIG. 3b is a structural diagram showing the sectional view of the DBR laser device. Particularly, in the DBR laser device shown in FIG. 3b, an active layer 43 of undoped GaAs is surrounded by wave guiding-layers 41 and 42 of undoped AlGaAs.

In these laser devices, diffraction gratings 40 are formed in the active layer or layers in the vicinity of the active layer as shown in FIGS. 3a and 3b so that a single longitudinal axial mode oscillation is steadily realized. The DBR laser device produces a single oscillating spectrum in high-speed modulation as shown in FIG. 2b from which it is clear that a multi mode oscillation such as that of FIG. 2a is not occurred.

On the other hand, the DFB laser device shown in FIG. 3a has the diffraction grating structure 40 in the vicinity of the active layer 43 so that a favorable crystallinity in the active layer 43 can not be obtained. Also, since the active region and the diffraction grating region can not be independently provided, it is difficult to operate laser oscillation at low threshold current. Further, there occurs a chirping phenomenon in high-speed modulation. Therefore, the DBR laser has been more hopeful in practical use rather than the DFB laser.

Since laser light is largely attenuated in layers having the same composition as that of the active layer even in the DBR laser, however, the wave guiding layers 41 and 42 under or above the diffraction grating configuration 40 must have a different composition from that of the active layer 43 as shown in FIG. 3b. Accordingly, there has been a need for complicated and difficult processes for growth of these layers in the DBR laser device.

SUMMARY OF THE INVENTION

An object of the present invention is to provide a high efficient semiconductor laser having an novel structure in order to eliminate the above drawbacks in the conventional semiconductor lasers.

Another object of the present invention is to provide a semiconductor laser device which is readily manufactured and is capable of a high speed operation with a low threshold current.

According to the present invention, the semiconductor laser device is of a double heterojunction structure type. In particular, an active layer of the semiconductor laser device is composed of a so-called quantum well (QW) structure in which a thin semiconductor film having a narrow energy band gap is sandwiched by two thin semiconductor films each having a wide energy band gap. Alternatively, the active layer is constituted of a multi-quantum well (MQW) in which the above quantum well structure is repeatedly stacked in one direction. Further, the semiconductor laser device of the invention comprises a diffraction grating in a regular waveform as used in the DBR laser device as shown in FIG. 3b. That is, Optical wave guiding layers in vicinity of the diffraction grating can be replaced by a simple active layer consisting of the quantum well structure. Accordingly, it is not necessary for its manufacturing to employ the complicated processes for growing the active layer combined with the optical guiding layers having different compositions from that of the active layer as used in the DBR laser manufacturing as shown in FIG. 3b.

According to the present invention, there is provided a light emitting double heterojunction semiconductor device of injection type comprising:
a first semiconductor layer of a first conductive type;

a second semiconductor layer of a second conductive type which is different from the first conductive type;

an active layer composed of laminated semiconductor layers of the quantum well structure interposed between the first and second semiconductor layers and having a narrower effective energy band gap than those of the first and second semiconductor layers; and a diffraction grating formed in either one of the first and second semiconductor layers.

According to a preferred embodiment of the present invention, a first electrode is formed on a predetermined area of the outer surface of either one of the first and second semiconductor layers, and the diffraction grating is formed only at the portions corresponding to the both opposite sides of the predetermined area on which the first electrode is formed, so that the active layer constitutes an active area and waveguide areas at the same time.

According to a further preferred embodiment of the present invention, either one of the first and second semiconductor layers is composed of two semiconductor layers of the same conductive type of which the energy band gaps are different from each other, and the interface of these two semiconductor layers is formed to present a regular waveform at said portions to thereby form diffraction gratings.

According to another embodiment of the invention, the first semiconductor layer is composed of a buffer layer formed on a semiconductor substrate of the same conductive type as the first semiconductor layer, and a second electrode is formed on the outer surface of the semiconductor substrate, while the second semiconductor layer is composed of a cladding layer and a contact layer of the same conductive type with each other, and the first electrode is formed on the contact layer.

The diffraction grating may be formed in the second semiconductor layer. In this case, the cladding layer may be composed of two semiconductor layers of which the energy band gaps are different from each other and the diffraction grating is formed at the interface therebetween. Otherwise, the contact layer may be formed only on a predetermined surface area of the cladding layer, while other surface area of the cladding layer is worked to present the diffraction grating.

According to a further preferred embodiment of the invention, the buffer layer is composed of two semiconductor layers of which the energy band gaps are different from each other and the diffraction grating is formed at the interface therebetween.

According to a preferred embodiment of the invention, the active layer is composed of two kinds of thin semiconductor layers having a different energy band gap from each other and laminated on each other.

The active layer may be composed of laminated layers of InP and $In_{0.53}Ga_{0.47}As$, $In_{0.52}Al_{0.48}As$ and $In_{0.53}Ga_{0.47}As$, or GaSb and $Al_xGa_{1-x}Sb$ $(0 < X < 1)$.

DETAILED DESCRIPTION OF THE PREFERRED EMBODIMENTS

Hereinafter, the embodiments of the present inventions are described in detail with reference to the accompanying drawings.

Figure 1:
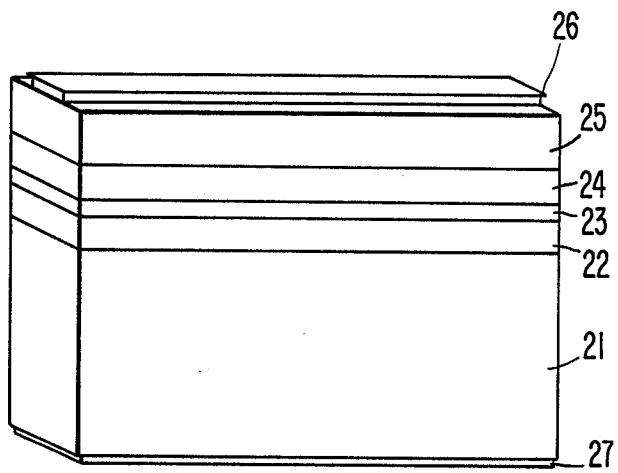
FIG. 1 is a structural diagram showing its sectional view of a conventional double heterojunction semiconductor laser device.
Figure 4A:
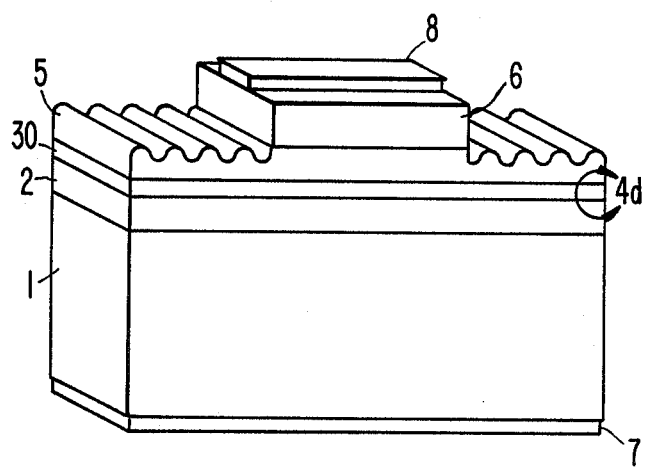
FIGS. 4a and 4d are structural diagrams showing sectional views of a semiconductor laser device according a first embodiment of the present invention.

FIG. 4a is a structural diagram showing its sectional view of a semiconductor laser device according to a first embodiment of the present invention.

Figure 4D:
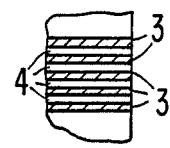
Figure 2A:
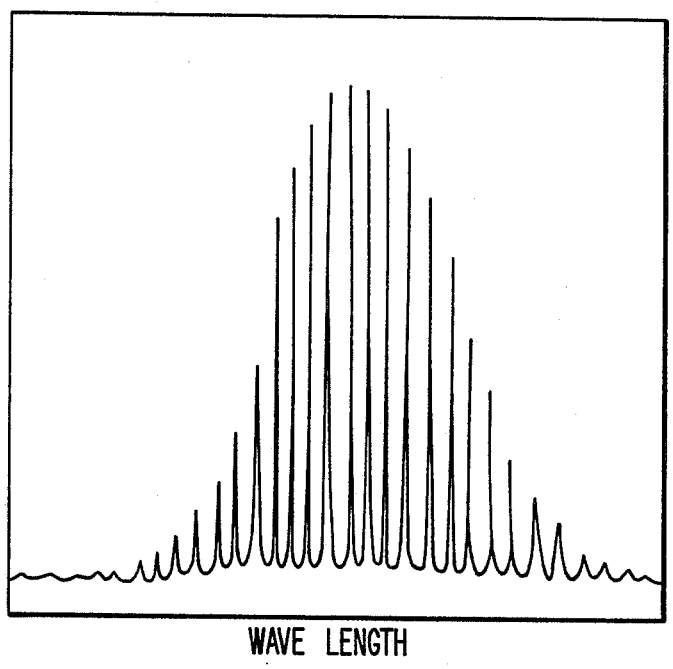
FIG. 2a is a diagram showing oscillating spectra of the conventional double heterojunction semiconductor laser device in DC modulation.
Figure 2B:
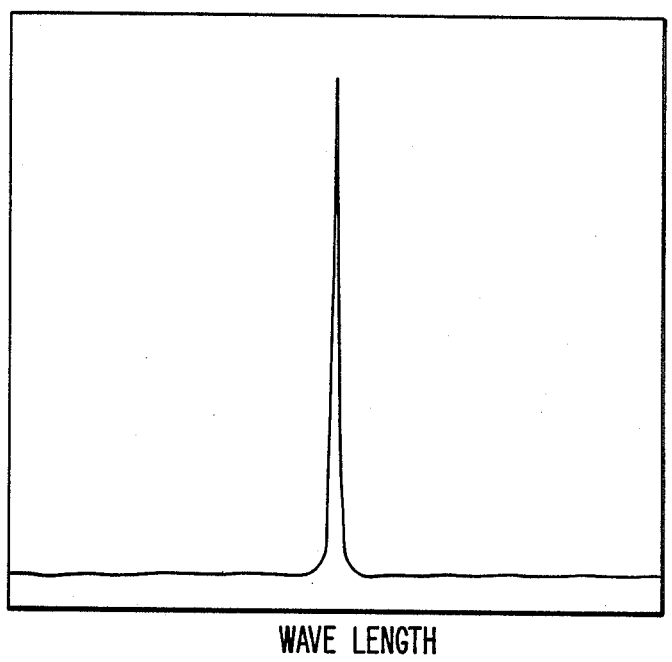
FIG. 2b is a diagram showing oscillating spectra of a Distributed Bragg Reflector semiconductor laser device.
Figure 3A:
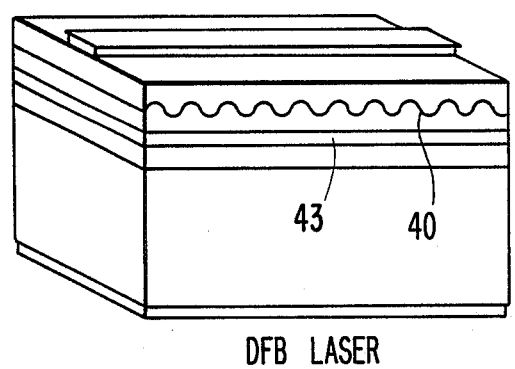
FIG. 3a is a structural diagram showing its sectional view of a Distributed Feedback semiconductor laser device.
Figure 3B:
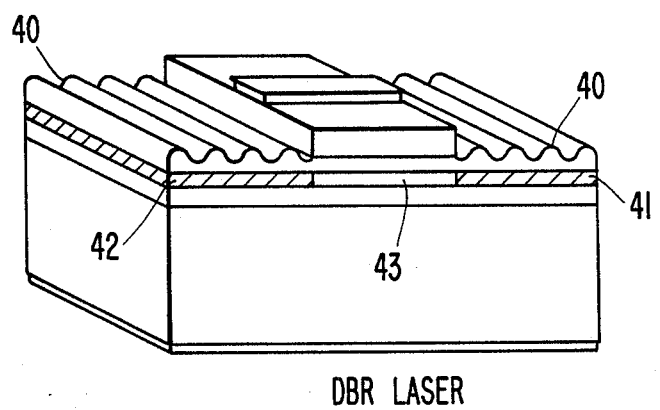
FIG. 3b is a structural diagram showing its section view of a Distributed Bragg Reflector semiconductor laser device.

In FIG. 4a, firstly a buffer (graded) layer 2 of 2 microns in thickness of n-type $Al_{0.48}In_{0.52}As$ doped with Sn (n-type impurity concentration: $3 \times 10^{18}$ 1/cm$^3$) is grown on a substrate 1 of S-doped InP. On the buffer layer 2, a well layer 3 of $Ga_{0.47}In_{0.53}As$ and a barrier layer 4 of $Al_{0.48}In_{0.52}As$ are repeatedly grown in the stated order so as to constitute an active layer 30 of a multi quantum well structure as shown in FIG. 4d. The active layer 30 is doped by Sn in amount of the order of $10^{17}$ 1/cm$^3$. In the active layer 30, the well layer 3 is 80 Å to 90 Å in thickness and the barrier layer 4 is 30 Å in thickness.

Subsequently, a cladding layer 5 of 2 microns in thickness of p-type $Al_{0.48}In_{0.52}As$ doped with Be (p-type impurity concentration: $1 \times 10^{18}$ 1/cm$^3$) and a contact layer 6 of p-type $Ga_{0.47}In_{0.53}As$ doped with Be (p-type impurity concentration: $1 \times 10^{19}$ 1/cm$^3$) are grown on the active layer 30 in the stated order. After the contact layer 6 is selectively etched or removed so as to expose the top surface of the cladding layer 5 at the both sides of the contact layer 6, diffraction grating configurations are formed on the two exposed surfaces of the cladding layer 5 by an etching technique using an interference pattern of laser light as shown in FIG. 4a. Finally, an ohmic electrode 7 is formed on a reverse surface of the substrate 1 while a stripe type ohmic electrode 8 is formed on the contact layer 6.

In the above semiconductor laser device, the $Al_{0.48}In_{0.52}As$ layers used in the buffer layer 2 and the cladding layer 5 are replaceable by InP layers. The well layer 3 is replaceable by an $In_{0.53}Ga_{0.47}As$ layer while the barrier layer 4 is replaceable by an InP layer. In addition, the contact layer 6 is replaceable by a mixed crystal layer of four elements InGaAsP.

Figure 4B:
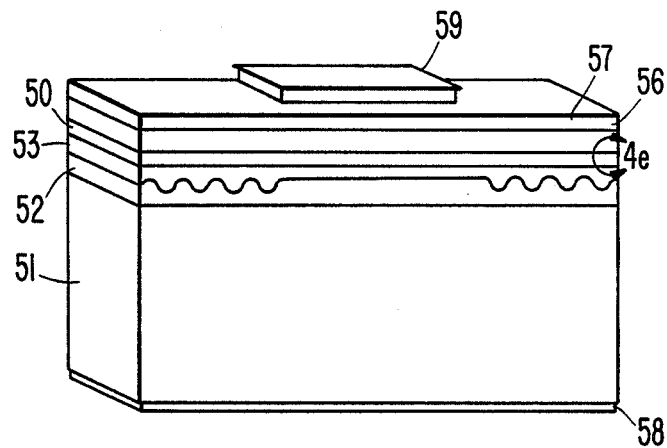
FIGS. 4b and 4e are structural diagrams showing sectional views of a semiconductor laser device according to a second embodiment of the present invention.

FIG. 4b is a structural diagram showing its sectional view of a semiconductor laser device according to a second embodiment of the present invention.

Figure 4E:
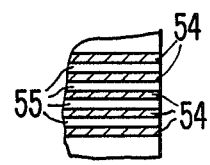

In FIG. 4b, firstly, a layer 52 of 2 microns in thickness of n-type InP doped with Sn (n-type impurity concentration: $2\times10^{18}$ 1/cm$^3$) is grown on a substrate 51 of S-doped InP. After that, diffraction grating configurations are formed on the InP layer 52 at its both sides by an etching technique using an interference pattern of laser light. Subsequently, a four element-mixed crystal layer 53 of p-type InGaAsP doped with Sn (p-type impurity concentration of $2\times10^{18}$ 1/cm$^3$) having an emission spectrum of about 1.3 microns in wavelength is grown entirely on the InP layer 52. One example of such p-type InGaAsP is $In_{0.73}Ga_{0.27}As_{0.60}P_{0.40}$. Then, on the mixed crystal layer 53, a well layer 54 of 118 Å in thickness of undoped $In_{0.53}Ga_{0.47}As$ and a barrier layer 55 of 118Å in thickness of undoped InP are repeatedly grown in the stated order so as to constitute an active layer 50 as shown in enlarged view of FIG. 4e. A layer 56 of 2 microns in thickness of InP doped with Zn (p-type impurity concentration: $2\times10^{18}$ 1/cm$^3$) and a contact layer 57 of 1 micron in thickness of p-type $In_{0.53}Ga_{0.47}As$ doped with Zn (p-type impurity: $1\times10^{19}$ 1/cm$^3$) are grown on the active layer 50 in the stated order. Finally, an ohmic electrode 58 is formed on the reverse surface of the InP substrate 51 while an ohmic electrode 59 is formed on a surface portion of the contact layer 57 beneath which there are not provided the diffraction grating configurations.

Figure 4C:
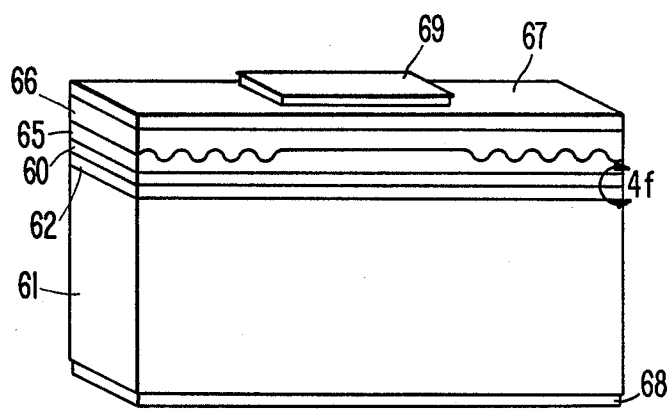
FIGS. 4c and 4f are structural diagrams showing sectional views of a semiconductor laser device according to a third embodiment of the present invention.

FIG. 4c is a structural diagram showing its sectional view of a semiconductor layer device according to a third embodiment of the present invention.

Figure 4F:
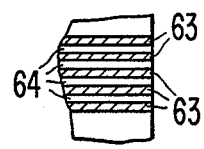

In FIG. 4c, an n-type InP layer 62 of 2 microns in thickness of n-type InP doped with Sn (n-type impurity concentration: $2\times10^{18}$ 1/cm$^3$) is grown on a substrate 61 of S-doped InP. A well layer 63 of 118 Å in thickness of undoped $In_{0.53}Ga_{0.47}As$ and a barrier layer 64 of 118 Å in thickness of undoped InP are repeatedly grown in the stated order on the InP layer 62 so as to constitute an active layer 60 as shown in FIG. 4f. Subsequently, a four element-mixed crystal layer 65 of p-type InGaAsP doped with Zn (p-type impurity concentration: $2\times10^{18}$ 1/cm$^3$), for example $In_{0.73}Ga_{0.27}As_{0.60}P_{0.40}$, having an emission spectrum of about 1.3 microns in wavelength is grown on active layer 60. After that, diffraction grating configurations are formed on the mixed crystal layer 65 at its both sides by an etching technique using an interference pattern of laser light. Next, a layer 66 of 2 microns in thickness of p-type InP doped with Zn (p-type impurity concentration: $2\times10^{18}$ 1/cm$^3$) and a contact layer 67 of 1 micron in thickness of p-type $In_{0.53}Ga_{0.47}As$ doped with Zn (p-type impurity concentration: $1\times10^{19}$ 1/cm$^3$) are grown in the stated order on the mixed crystal layer 65. Finally, an ohmic electrode 68 is formed on a reverse surface of the InP substrate 61 while an ohmic electrode 69 is formed on a surface portion of the contact layer 67 beneath which there are not provided the diffraction grating configurations.

A relationship between light absorption spectra and laser oscillating wavelengths in the double heterojunction semiconductor and the semiconductor including an active layer of the quantum well structure is reported as an experimental result in "JPN. J. APPL. PHYS.", Tarucha et al., 22, L482 (1983) as shown in FIG. 5.

Figure 5:
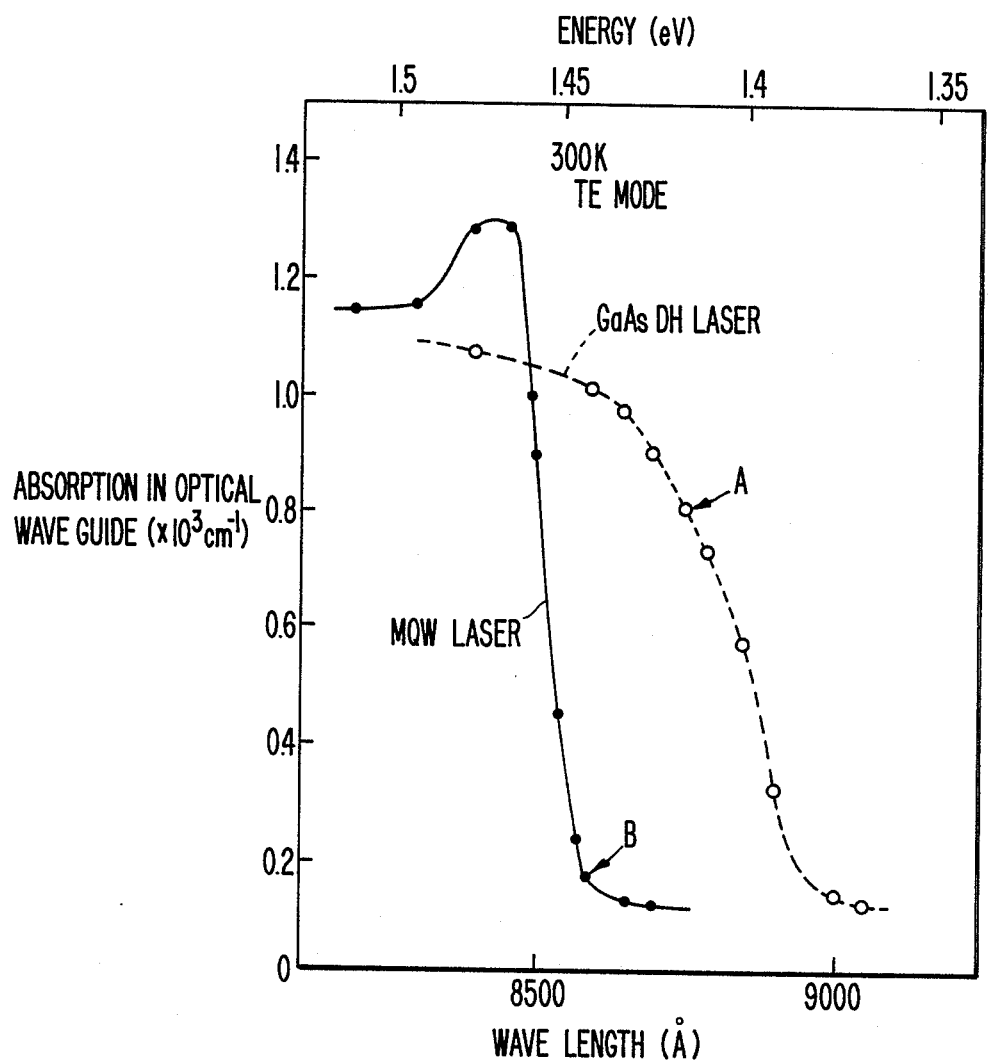
FIG. 5 is a graph showing a relationship between optical absorption and wavelength of laser oscillation in a light emitting semiconductor device of ordinary double heterojunction structure and that including an active layer of multi quantum well structure.

In FIG. 5, a wavelength of laser oscillation in a GaAs double heterostructure laser is indicated by a point A and a wavelength of laser oscillation in a multi quantum well (MQW) structure laser is indicated by a point B. As is clear from the FIG. 5, the laser oscillation in the double heterostructure laser occurs at a relatively high position of the light absorption (780 cm$^{-1}$) while the laser oscillation in the laser of the multi quantum well structure occurs at an extremely low position of the light absorption (180 cm$^{-1}$). Therefore, it is possible to employ an active layer of the multi quantum well (or single quantum well) structure itself as an optical waveguide layer in a laser device. That is, it is possible to directly employ an active layer of the multi quantum well structure itself as the optical waveguide layer beneath or above the diffraction grating configuration of ridges and recesses region as shown in FIG. 4.

In the above embodiments, there is no description of the optical confinement in the transverse direction. However, any means such as a refractive index-waveguiding and a gain-guiding which have been recently developed are applicable thereto. Further, the semiconductor laser device of the present invention is not limited to only the InP-InGaAs-AlInAs type materials as described in the above embodiments, but also GaAs-AlGaAs materials and the like are applicable thereto.

In case a light emitting semiconductor device shown in FIG. 4 (a) is prepared from GaAs-AlGaAs semiconductor layers, the buffer layer 2 and the cladding layer 5 may be composed respectively of n-type and p-type $Al_{0.50}Ga_{0.50}As$ which are formed on a substrate 1 of GaAs.

Further, in case a light emitting semiconductor device shown in FIG. 4 (c)- is prepared from GaAs-AlGaAs semiconductor layers, the substrate 61 and the buffer layer 62 may be composed respectively of GaAs and n-type $Al_{0.50}Ga_{0.50}As$, while the buffer layers 65 and 66 may be composed respectively of $Al_{0.40}Ga_{0.60}As$ and $Al_{0.60}Ga_{0.40}As$.

Moreover, as described above, the present invention can be accomplished by using a single quantum well structure other than a multi quantum well structure in which a well layer and a barrier layer are repeatedly stacked one over another.

As described above, the present invention relates to a semiconductor laser device which is of a Distributed Bragg Reflector type producing a stabilized oscillating mode at high-speed modulation. However, for the provision of the multi quantum well structure used as the active layer, it is not necessary for its manufacturing to use complicated processes for growing a construction layer of an active layer surrounded by waveguiding layers having different compositions from that of the former. That is, since the active layer of the multi quantum well structure itself is applicable as a optical waveguide layer, its manufacturing processes are readily conducted and further it is possible to desire a high reliability and yield. Also, since the multi quantum well structure is employed in the present invention, the resultant laser device can operate at a low threshold current and with a highly selectivity of TE mode. Furthermore, it is easy for the semiconductor layer of the invention to introduce its emitted laser light to the other optical waveguides, so that the semiconductor laser device is highly applicable to an Opto-Electronic IC (OEIC).

Thus, the present invention provides a high efficient semiconductor laser which has been not found in the conventional laser devices, so that its optical techniques are greatly effective for the optical devices.

I claim:

1. A light emitting double heterojunction semiconductor device of injection type comprising:
   a first semiconductor layer of a first conductive type;
   a second semiconductor layer of a second conductive type which is different from the first conductive type;

an active layer composed of laminated semiconductor layers of the quantum well structure interposed and extended beneath the first and second semiconductor layers and having a narrower effective energy band gap than those of the first and second semiconductor layers;

a first electrode formed on the surface of the first semiconductor layer opposite a surface facing the active layer and a second electrode formed on the surface of the second semiconductor layer opposite a surface facing the active layer such that a portion of the active layer sandwiched between the first and second electrodes forms an active region for laser oscillation: and a pair of diffraction gratings formed in either one of the first and second semiconductor layers such that a grating is positioned at each side of the active region, whereby said active layer functions as the active region and as a waveguide region.

2. A light emitting double heterojunction semiconductor device as claimed in claim 1, wherein the first electrode is formed on a predetermined area of the outer surface of either one of the first and second semiconductor layers, said diffraction gratings being formed in said one of said first and second semiconductor layers at opposite sides of said predetermined area.

3. A light emitting double heterojunction semiconductor device as claimed in claim 2, wherein either one of the first and second semiconductor layers is composed of two semiconductor layers of the same conductive type of which the energy band gaps are different from each other, the interface of these two semiconductor layers being formed to present a regular waveform at said portions to thereby form diffraction gratings.

4. A light emitting double heterojunction semiconductor device as claimed in claim 2, wherein the first semiconductor layer is composed of a buffer layer formed on a semiconductor substrate of the same conductive type as the first semiconductor layer, the second electrode being formed on the outer surface of the semiconductor substrate, and wherein the second semiconductor layer is composed of a cladding layer and a contact layer of the same conductive type with each other, the first electrode being formed on the contact layer.

5. A light emitting double heterojunction semiconductor devices as claimed in claim 4, wherein the diffraction grating is formed in said second semiconductor layer.

6. A light emitting double heterojunction semiconductor device as claimed in claim 5, wherein the cladding layer is composed of two semiconductor layers of which the energy band gaps are different from each other and the diffraction grating is formed at the interface therebetween.

7. A light emitting double heterojunction semiconductor device as claimed in claim 4, the buffer layer is composed of two semiconductor layers of which the energy band gaps are different from each other and the diffraction grating is formed at the interface therebetween.

8. A light emitting double heterojunction semiconductor device as claimed in claim 4, wherein the active layer is composed of two kinds of thin semiconductor layers having a different energy band gap from each other and laminated on each other.

9. A light emitting double heterojunction semiconductor device as claimed in claim 4, wherein the semiconductor substrate is composed of InP.

10. A light emitting double heterojunction semiconductor device as claimed in claim 9, said active layer is composed of laminated layers of InP and $In_{0.53}Ga_{0.47}As$.

11. A light emitting double heterojunction semiconductor device as claimed in claim 9, wherein the active layer is composed of laminated layers of $In_{0.52}Ga_{0.48}As$ and $In_{0.53}Ga_{0.47}As$.

12. A light emitting double heterojunction semiconductor device as claimed in claim 9, wherein the semiconductor layers between which the diffraction grating is formed are composed respectively of InP and InGaAsP.

13. A light emitting double heterojunction semiconductor devices as claimed in claim 4, wherein the semiconductor substrate is composed of GaAs.

14. A light emitting double heterojunction semiconductor device as claimed in claim 13, wherein the active layer is composed of laminated layers of GaAs and $Al_xGa_{1-x}As$ ($0 < X < 1$).

15. A light emitting double heterojunction semiconductor devices as claimed in claim 14, wherein the semiconductor layers between which the diffraction grating is formed are composed respectively of $Al_xGa_{1-x}As$ and $Al_yGa_{1-x}As$ ($x \neq y$).

16. A light emitting double heterojunction semiconductor device as claimed in claim 2, further comprising a semiconductor substrate on which the first semiconductor layer is formed as the buffer layer and a second electrode is formed on the outer surface of the semiconductor substrate, said second semiconductor layer being composed of a cladding layer and a contact lay of the same conductive type with each other, a first electrode being formed on the outer surface of the contact layer, and wherein the contact layer is formed only on a predetermined surface area of the cladding layer and the cladding layer presents regular waveform at the outer surface area which is not covered by the contact layer, whereby forming diffraction gratings.

17. A light emitting double heterojunction semiconductor devices as claimed in claim 16, wherein the cladding layer is composed of two semiconductor layers of which the energy band gaps are different from each other and the diffraction grating is formed at the interface therebetween.

18. A light emitting double heterojunction semiconductor device as claimed in anyone of claim 16, wherein the semiconductor substrate is composed of InP.

19. A light emitting double heterojunction semiconductor device as claimed in claim 18, the active layer is composed of laminated layers of InP and $In_{0.53}Ga_{0.47}As$.

20. A light emitting double heterojunction semiconductor device as claimed in claim 16, wherein the active layer is composed of laminated layers of $In_{0.52}Al_{0.48}As$ and $In_{0.53}Ga_{0.47}As$.

21. A light emitting double heterojunction semiconductor device as claimed in anyone of claim 16, wherein the semiconductor substrate is composed of GaAs.

22. A light emitting double heterojunction semiconductor device as claimed in claim 21, wherein the semiconductor layers between which the diffraction grating is formed are composed respectively of $Al_xGa_{1-x}As$ and $Al_yGa_{1-y}As$ ($x \neq y$).

* * * * *

UNITED STATES PATENT AND TRADEMARK OFFICE
CERTIFICATE OF CORRECTION

PATENT NO. : 4,815,087
DATED : March 21, 1989
INVENTOR(S) : HIDEKI HAYASHI

It is certified that error appears in the above-identified patent and that said Letters Patent is hereby corrected as shown below:

Claim 1, col. 7, line 3, "beneath" should be --between--;

Claim 10, col. 8, line 7, "47" should be --$_{47}$-- (subscript);

Claim 11, col. 8, line 10, "$In_{0.52}Ga_{0.48}As$" should be --$In_{0.52}Al_{0.48}As$--;

Claim 15, col. 8, line 25, "devices" should be --device--;

Claim 15, col. 8, line 28, "$Al_yGa_{1-x}As$" should be --$Al_yGa_{1-y}As$--;

Claim 17, col. 8, line 44, "devices" should be --device--;

Claim 19, col. 8, line 55, "47" should be --$_{47}$-- (subscript).

Signed and Sealed this

Twenty-sixth Day of September, 1989

Attest:

DONALD J. QUIGG

Attesting Officer

Commissioner of Patents and Trademarks